United States Patent
Hamabe

(10) Patent No.: US 11,522,577 B2
(45) Date of Patent: Dec. 6, 2022

(54) RADIO WAVE ENVIRONMENT DISPLAY SYSTEM AND RADIO WAVE ENVIRONMENT DISPLAY METHOD

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 121 days.

(21) Appl. No.: 17/065,732

(22) Filed: Oct. 8, 2020

(65) Prior Publication Data
US 2021/0028821 A1   Jan. 28, 2021

Related U.S. Application Data

(63) Continuation of application No. PCT/JP2019/015366, filed on Apr. 8, 2019.

(30) Foreign Application Priority Data

Apr. 10, 2018   (JP) .............................. JP2018-075634

(51) Int. Cl.
*H04B 3/52* (2006.01)
*G01R 29/08* (2006.01)
(Continued)

(52) U.S. Cl.
CPC .............. *H04B 3/52* (2013.01); *G01R 29/08* (2013.01); *H04W 16/18* (2013.01); *H04W 24/10* (2013.01)

(58) Field of Classification Search
CPC ......... H04B 3/52; H04W 16/18; H04W 24/10
See application file for complete search history.

(56) References Cited

U.S. PATENT DOCUMENTS 5,585,805 A * 12/1996 Takenaka ................ G01S 11/02
                                                    342/461
8,024,002 B2 * 9/2011 Kitakado ................. H01Q 3/26
                                                    455/220
(Continued)

FOREIGN PATENT DOCUMENTS

JP     2005-080141     3/2005
JP     2006-352385     12/2006
(Continued)

OTHER PUBLICATIONS

International Search Report dated Jun. 25, 2019 in International (PCT) Application No. PCT/JP2019/015366 with English translation.

(Continued)

*Primary Examiner* — Brenda H Pham
(74) *Attorney, Agent, or Firm* — Wenderoth, Lind & Ponack, L.L.P.

(57) ABSTRACT

A radio wave environment display system includes a measurement antenna and a radio wave environment display device. The measurement antenna measures a radio wave intensity of a first radio wave transmitted by the wireless communication service, and performs a scan of radio wave intensities of radio waves including the first radio wave in a target area. The radio wave environment display device includes a processor configured to: select a radio wave intensity of a second radio wave having a frequency the same as or in the vicinity of a frequency of the first radio wave from the radio waves obtained by the scan; and calculate a communication environment of a wireless communication service on the basis of a difference between the radio wave intensity of the first radio wave and the radio wave intensity of the second radio wave.

7 Claims, 9 Drawing Sheets

(51) Int. Cl.
*H04W 16/18* (2009.01)
*H04W 24/10* (2009.01)

(56) References Cited

U.S. PATENT DOCUMENTS

| | | | |
|---|---|---|---|
| 2004/0087268 A1* | 5/2004 | Hatano | H04W 72/0486 455/7 |
| 2004/0214595 A1* | 10/2004 | Hogyoku | H04B 1/44 455/90.2 |
| 2005/0048965 A1 | 3/2005 | Ebata | |
| 2008/0200195 A1 | 8/2008 | Abe et al. | |
| 2009/0239532 A1 | 9/2009 | Ebata | |
| 2018/0351631 A1 | 12/2018 | Hamabe et al. | |

FOREIGN PATENT DOCUMENTS

| | | |
|---|---|---|
| JP | 2007-27902 | 2/2007 |
| JP | 2009-152976 | 7/2009 |
| JP | 2013-074305 | 4/2013 |
| WO | 2005/117473 | 12/2005 |
| WO | 2017/134715 | 8/2017 |

OTHER PUBLICATIONS

Written Opinion of the International Searching Authority dated Jun. 25, 2019 in International (PCT) Application No. PCT/JP2019/015366.

* cited by examiner

RADIO WAVE ENVIRONMENT DISPLAY SYSTEM AND RADIO WAVE ENVIRONMENT DISPLAY METHOD

CROSS-REFERENCES TO RELATED APPLICATIONS

This application is a continuation of PCT International Patent Application No. PCT/JP2019/015366 filed on Apr. 8, 2019, which claims the benefit of priority of Japanese Patent Application No. 2018-075634 filed on Apr. 10, 2018, the enter contents of which are incorporated herein by reference.

FIELD

The present disclosure relates to a radio wave environment display system and a radio wave environment display method.

BACKGROUND

JP-A-2006-352385 discloses a method for recognizing quality of reception from each of plural base stations installed in an area that is a target of estimation at each of very small intervals obtained by dividing the area. JP-A-2006-352385 discloses a method for inferring an area where a handover will occur by detecting a handover condition by referring to the difference between reception quality at each very small interval and another very small interval adjacent to it.

SUMMARY

The concept of the present disclosure has been conceived in view of the above circumstances in the art, and an object of the disclosure is therefore to provide a radio wave environment display system and a radio wave environment display method that visually present whether a communication environment of a wireless communication service provided in an area so as to be usable by users is good and thereby suppress lowering of the ease of use of the users.

The disclosure provides a radio wave environment display system including: a measurement antenna which is installed in a target area of a wireless communication service; and a radio wave environment display device configured to analyze a communication environment of the wireless communication service using radio wave intensities of radio waves received by the measurement antenna, wherein the measurement antenna measures a radio wave intensity of a first radio wave transmitted by the wireless communication service, and performs a scan of radio wave intensities of a plurality of radio waves including the first radio wave in the target area, and wherein the radio wave environment display device includes a processor configured to: select at least one radio wave intensity of at least one second radio wave having a frequency that is the same as or in the vicinity of a frequency of the first radio wave from the plurality of radio waves obtained by the scan; and calculate a communication environment of the wireless communication service on the basis of a difference between the radio wave intensity of the first radio wave and the at least one radio wave intensity of the at least one second radio wave, and causes a display to display thereon the communication environment.

The disclosure also provides a radio wave environment display method in a radio wave environment display system including a measurement antenna which is installed in a target area of a wireless communication service and a radio wave environment display device configured to analyze a communication environment of the wireless communication service using radio wave intensities of radio waves received by the measurement antenna, the radio wave environment display method including: measuring, by the measurement antenna, a radio wave intensity of a first radio wave transmitted by the wireless communication service; performing, by the measurement antenna, radio wave intensities of a plurality of radio waves including first radio wave in the target area; selecting, by the radio wave environment display device, at least one radio wave intensity of at least one second radio wave having a frequency that is the same as or in the vicinity of a frequency of the first radio wave from the plurality of radio waves obtained by the scan; and calculating, by the radio wave environment display device, a communication environment of the wireless communication service on the basis of a difference between the radio wave intensity of the first radio wave and the at least one radio wave intensity of the at least one second radio wave, and causing a display to display thereon the communication environment.

The disclosure makes it possible to visually present whether a communication environment of a wireless communication service provided in an area so as to be usable by users is good and thereby suppress lowering of the ease of use of the users.

DETAILED DESCRIPTION

Figure 1:
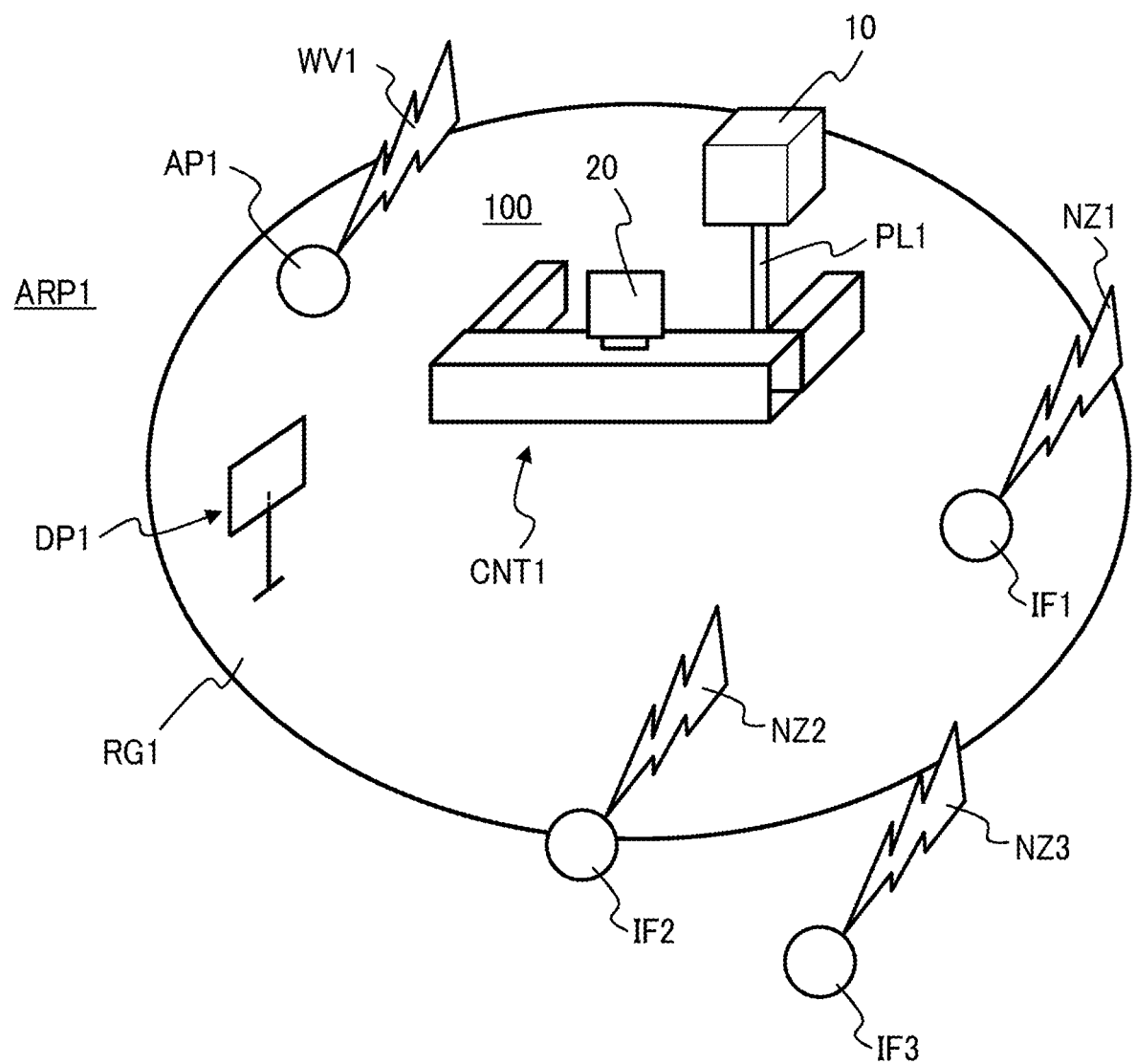
FIG. 1 is a diagram showing an example target area including a counter where a measurement antenna device employed in a first embodiment is installed in an airport.

Introduction to the Content of Embodiment 1

For example, it frequency occurs that the radio wave environment of a wireless LAN (local area network) service such as WiFi (registered trademark) that is provided in an area such as an airport or a train station so as to be usable by travelers etc. free of charge is degraded being affected by radio waves transmitted (radiated) from a mobile router or the like owned by a traveler or the like and brought to the area. Furthermore, the radio wave environment of the wireless LAN service varies, every time a traveler who possesses a mobile router or the like moves in the area. That is, since the ease of use (i.e., whether the communication environment in the area is good) of the wireless LAN service provided in the area so as to be usable free of charge is not indicated visually, the ease of use of travelers etc. who want to use it is low. In the above-described JP-A-2006-352385, no consideration is given to visually presenting whether a communication environment in an area where a wireless LAN service can be used is good.

In view of the above, each of the following embodiments will describe examples of a radio wave environment display system and a radio wave environment display method that visually present whether the communication environment of a wireless communication service in an area where it is provided so as to be usable by users is good and thereby suppress lowering of the ease of use of the users.

Each embodiment as a specific disclosure of a radio wave environment display system and a radio wave environment display method according to the present disclosure will be hereinafter described in detail by referring to the drawings when necessary. However, unnecessarily detailed descriptions may be avoided. For example, detailed descriptions of already well-known items and duplicated descriptions of constituent elements having substantially the same ones already described may be omitted. This is to prevent the following description from becoming unnecessarily redundant and thereby facilitate understanding of those skilled in the art. The following description and the accompanying drawings are provided to allow those skilled in the art to understand the disclosure thoroughly and are not intended to restrict the subject matter set forth in the claims.

Embodiment 1

In a first embodiment, a measurement antenna (see FIG. 3) is installed permanently in a target area to visualize the radio wave environment of a desired wireless LAN service such as WiFi (registered trademark) that is provided in an airport, a train station, or the like so as to be usable by travelers free of charge. The measurement antenna receives a first radio wave (in other words, a main signal) transmitted (radiated) from an access point corresponding to radio identification information (e.g., SSID (service set identifier)) of the desired wireless LAN service or a plurality of radio waves including the first radio wave and measures radio wave intensity of each of the radio waves. A PC (an example of a term "radio wave environment display device") connected to the measurement antenna calculates a communication environment in a target area of the desired wireless LAN service on the basis of the radio wave intensity of each of the radio waves received by the measurement antenna and displays it on a monitor (an example of a term "display").

For example, the term "radio waves" as used herein includes not only radio waves corresponding to a main signal in a frequency band corresponding to the desired wireless LAN service but also radio waves corresponding to a radio signal in a frequency band that is the same as or in the vicinity of the former frequency band (in other words, may interfere with the main signal). The radio wave intensity is an index indicating reception quality of radio waves received by the measurement antenna. The reception quality is, for example, signal power or reception electric field intensity of a received signal. The communication environment is an index (e.g., a radio of 0% to 100%) quantitatively indicating whether a wireless communication of the desired wireless LAN service can be performed satisfactorily in the target area. For example, a wireless communication using the wireless LAN service can be performed satisfactorily if the communication environment is equal to 100%, and cannot be performed satisfactorily if the communication environment is equal to 0%.

First, the target area in which a radio wave environment display system 100 according to the first embodiment is installed will be described with reference to FIG. 1. An area in which a counter CNT1 where many travelers gather is installed in an airport ARP1 will be described as an example of the target area; however, the target area is not limited to the area where the counter CNT1 is installed in the airport ARP1. FIG. 1 is a diagram showing an example target area RG1 including the counter CNT1, where a measurement antenna device 10 employed in the first embodiment is installed, in the airport ARP1.

As shown in FIG. 1, the counter CNT1 where, for example, many travelers are to gather for check-in in the airport ARP1 is installed in the target area RG1. The measurement antenna device 10 is installed permanently so as to, for example, be supported by a pole PL1 extending from a surface of a desk of the counter CNT1. APC 20 is installed on the desk of the counter CNT1. The manner of installation of the measurement antenna device 10 is not limited to being supported by the pole PL1; for example, the measurement antenna device 10 may be installed so as to hang down from a ceiling surface (not shown) over the counter CNT1 using a cord, for example.

In the target area RG1, a first radio wave (main signal WV1) are being transmitted (radiated) from an access point AP1 corresponding to a desired wireless LAN service such as WiFi (registered trademark) that is provided so as to be usable by travelers etc. free of charge in the airport ARP1. The measurement antenna device 10 receives the main signal WV1 in a measurement mode, measures radio wave intensity of the main signal WV1 at its reception, and outputs the measured radio wave intensity to the PC 20. In a scan mode, the measurement antenna device 10 receives a plurality of radio waves including the main signal WV1 existing in the target area RG1, measures radio wave intensity of the main signal WV1 at the time of reception of each of the radio waves, and outputs the measured radio wave intensity to the PC 20. The PC 20 calculates a communication environment of the wireless LAN service in the target area RG1 using the various radio wave intensity values supplied from the measurement antenna device 10 and outputs the calculated communication environment to a monitor DP1. The monitor DP1 is, for example, a large-size display that is installed in the target area RG1 at such a position as to be able to be seen by many travelers easily.

For example, the plural of radio waves are radio waves NZ1, NZ2, and NZ3 transmitted from respective signal sources IF1, IF2, and IF3 other than the main signal WV1 transmitted from the access point AP1. The measurement antenna device 10 is switched to the measurement mode or the scan mode in response to a mode switching signal (in other words, a measurement command (described later)) supplied from the PC 20, for example.

For example, the signal sources IF1, IF2, and IF3 are mobile routers that travelers etc. who have appeared in or near the target area RG1 in the airport ARP1 possess (i.e., radio wave signal sources that are different from the access point AP1 corresponding to the desired wireless LAN service in the airport ARP1). That is, the signal sources IF1, IF2, and IF3 transmit (radiate) the radio waves NZ1, NZ2, and NZ3 as disturbing waves that may degrade the wireless LAN communication environment. Although FIG. 1 shows three signal sources and three kinds of radio waves (disturbing waves) as examples, it goes without saying that they are not limited to three in number.

Where the target area RG1 is such a place that persons to enter there are required to be given strict security clearance, the signal sources IF1, IF2, and IF3 may include mobile routers that are not access points having a prescribed SSID that is registered in advance so as to be usable in the target area RG1; the same is true of another embodiment to follow.

Figure 2:
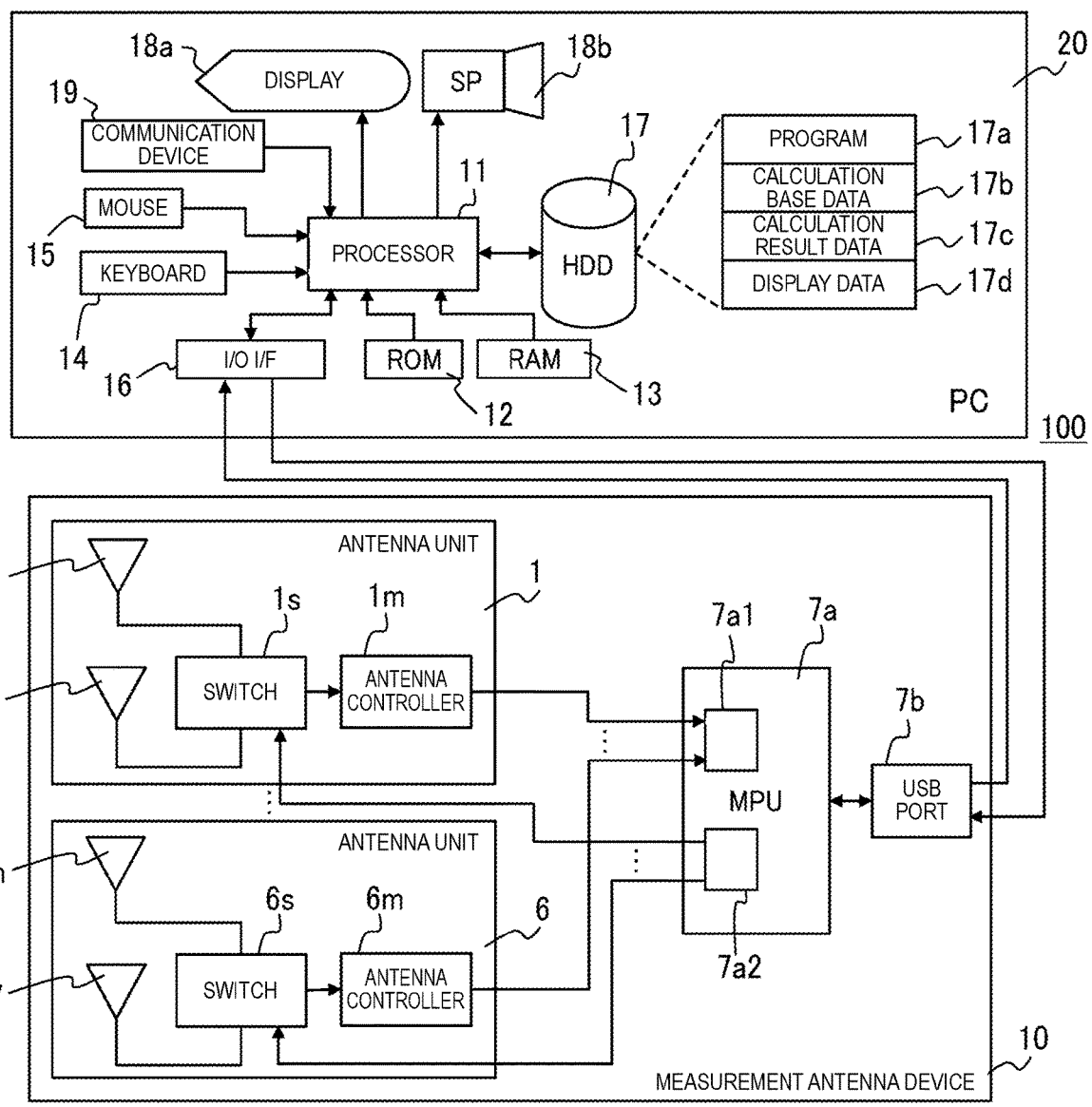
FIG. 2 is a block diagram showing example hardware configurations of a measurement antenna device and a PC employed in the first embodiment, respectively.

Next, the configurations of the measurement antenna device 10 and the PC 20 employed in the first embodiment will be described with reference to FIGS. 2 and 3. FIG. 2 is a block diagram showing example hardware configurations of the measurement antenna device 10 and the PC 20 which constitutes the radio wave environment display system 100 employed in the first embodiment, respectively. As shown in FIG. 2, the radio wave environment display system 100 is configured so as to include the measurement antenna device 10 and the PC 20 which is an example radio wave environment display device.

Figure 3:
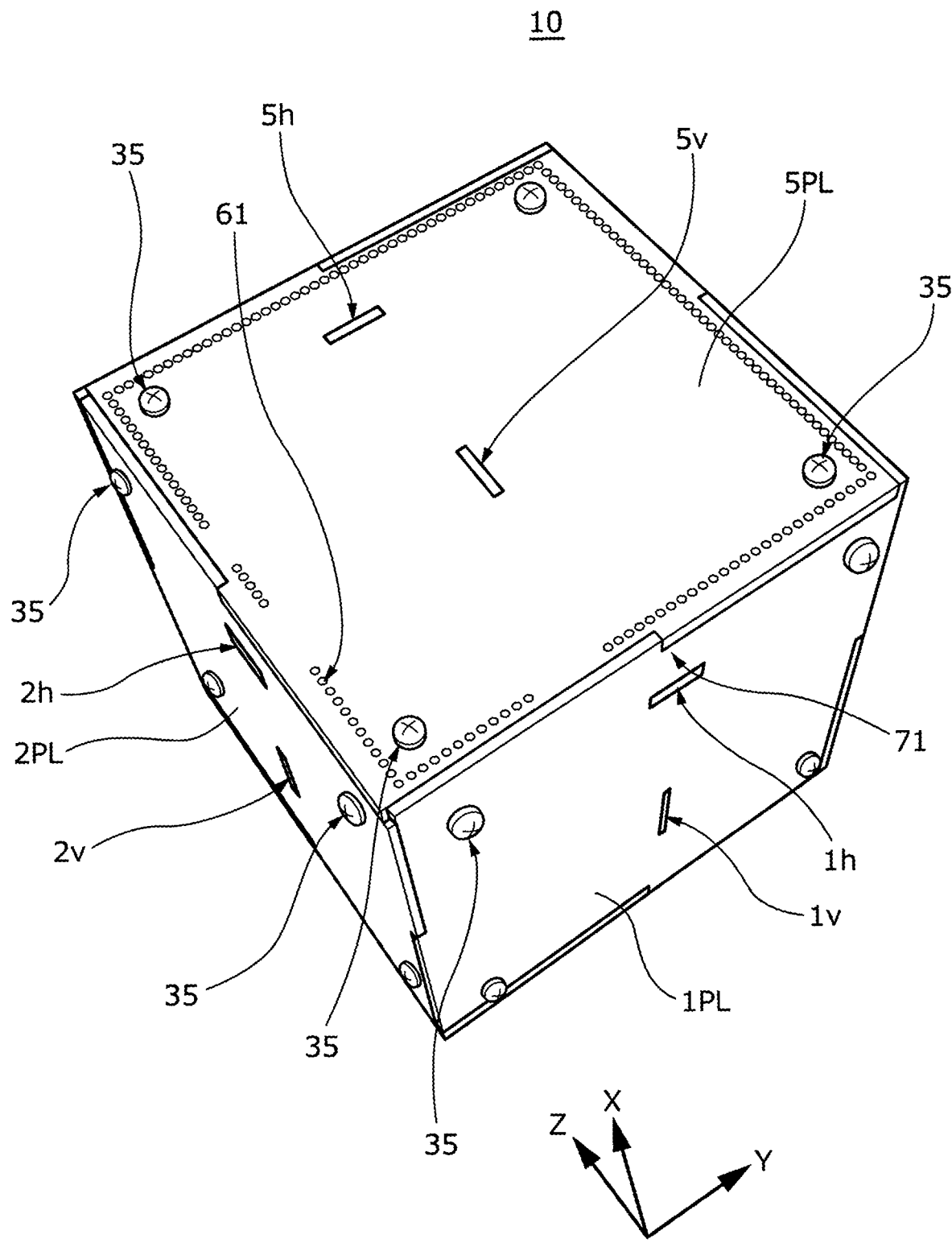
FIG. 3 is a perspective view showing an appearance of the measurement antenna device employed in the first embodiment.

FIG. 3 is a perspective view showing an appearance of the measurement antenna device 10 employed in the first embodiment. In the first embodiment, for example, the directions of the X axis, the Y axis, and the Z axis coincide with the directions indicated by arrows shown in FIG. 3. For example, the +X direction and the −X direction correspond to the top-bottom direction of a body of the measurement antenna device 10, the −Y direction and the +Y direction correspond to the left-right direction of the body of the measurement antenna device 10, and the −Z and the +Z direction correspond to the front-rear direction the body of the measurement antenna device 10.

As shown in FIG. 3, the measurement antenna device 10 has the body that is shaped like a polyhedron such as a rectangular prism shape (e.g., cuboid or cube) and is provided with antenna units 1, . . . , 6 that correspond to a total of six surfaces (more specifically, front surface 1PL, left surface 2PL, rear surface, right surface, top surface 5PL, and bottom surface) that constitute the body. As described above, the body of the measurement antenna device 10 is installed in such a manner that one surface (e.g., bottom surface) is supported by the pole PL1. As such, the measurement antenna device 10 is installed above the counter CNT1 permanently and can receive radio waves existing in the target area RG1.

As shown in FIG. 2, the measurement antenna device 10 is configured so as to include the antenna units 1-6, an MPU 7a, and a USB (Universal Serial Bus) port 7b. Since the antenna units 1-6 have the same configuration, to simplify the description the antenna unit 1 will be described as an example. In the following description of the antenna unit 1, each constituent element may read as a corresponding one of another antenna unit.

The antenna unit 1 includes a horizontally polarized antenna 1h, a vertically polarized antenna 1v, a switch 1s, and an antenna controller 1m.

The horizontally polarized antenna 1h receives a horizontally polarized component of the first radio wave (main signal WV1) being transmitted from the access point AP1 (see FIG. 1) corresponding to desired radio identification information through the target area RG1 and horizontally polarized components of radio waves being transmitted from the various signal sources 1F1-1F3, more specifically, horizontally polarized waves in a prescribed frequency band (e.g., 1.9-2.4 GHz band). The horizontally polarized antenna 1h is electrically connected to the switch 1s.

The vertically polarized antenna 1v receives a vertically polarized component of the first radio wave (main signal WV1) being transmitted from the access point AP1 (see FIG. 1) corresponding to the desired radio identification information through the target area RG1 and vertically polarized components of the radio waves being transmitted from the various signal sources 1F1-1F3, more specifically, vertically polarized waves in the prescribed frequency band (e.g., 1.9-2.4 GHz band). The vertically polarized antenna 1v is electrically connected to the switch 1s.

The switch 1s connects the horizontally polarized antenna 1h or the vertically polarized antenna 1v to the antenna controller 1m according to a switching signal that is output from a switching controller 7a2 of the MPU 7a time-divisionally for each of the surfaces constituting the body of the measurement antenna device 10. In other words, the switch is outputs an output of the horizontally polarized antenna 1h or the vertically polarized antenna 1v to the antenna controller 1m according to the above-mentioned switching signal.

The antenna controller 1m is configured using a circuit capable of processing a radio signal that complies with any of various wireless communication methods for the above-mentioned 1.9-2.4 GHz frequency band. Examples of the above wireless communication methods are wireless LANs of DECT (Digital Enhanced Cordless Telecommunications), Bluetooth (registered trademark), WiFi (registered trademark), etc. The antenna controller 1m takes out, as parallel-format data, an output (e.g., signal power or reception electric field intensity) of the horizontally polarized antenna 1h or the vertically polarized antenna 1v which is connected to the switch 1s, and outputs the parallel-format data to a data converter 7a1 of the MPU 7a.

The MPU (microprocessing unit) 7a, which functions as a controller of the measurement antenna device 10, performs control processing for controlling the operations of the individual units of the measurement antenna device 10 in a centralized manner, data input/output processing with the individual units of the measurement antenna device 10, data calculation processing, and data storing processing. The MPU 7a includes the data converter 7a1 and the switching controller 7a2.

When a measurement command for measurement of signal power of a signal having radio identification information (e.g., SSID (service set identifier)) designated by a system operator is sent from the PC 20, the MPU 7a receives the measurement command via a USB port 7b. Upon receiving the measurement command, the MPU 7a makes a transition to the measurement mode and controls the individual units of the measurement antenna device 10 to start a measurement of signal power of a signal (i.e., above-mentioned main signal WV1) having the SSID designated by the system operator. For example, in the measurement mode, the MPU 7a controls the antenna units 1-6 so that they receive a signal (i.e., above-mentioned main signal WV1) having the SSID designated by the system operator using the antennas installed on the respective surfaces.

When a measurement command (e.g., scan mode measurement command) for measurement of signal power values of radio waves transmitted from the access point AP1 of the above-mentioned main signal WV1 and the various signal sources (see FIG. 1) is sent from the PC 20, the MPU 7a receives the measurement command via the USB port 7b. Upon receiving the measurement command, the MPU 7a makes a transition to the scan mode and controls the individual units of the measurement antenna device 10 to start a measurement of signal power of a signal (i.e., above-mentioned main signal WV1) having the SSID designated by the system operator and signal power values of radio waves NZ1-NZ3 transmitted from the various signal sources IF1-IF3. For example, in the scan mode, the MPU 7a controls the antenna units 1-6 so that they receive, using the antennas installed on the respective surfaces, a signal (i.e., above-mentioned main signal WV1) having the SSID designated by the system operator and radio waves NZ1-NZ3 transmitted from the various signal sources IF1-IF3.

Figure 6:
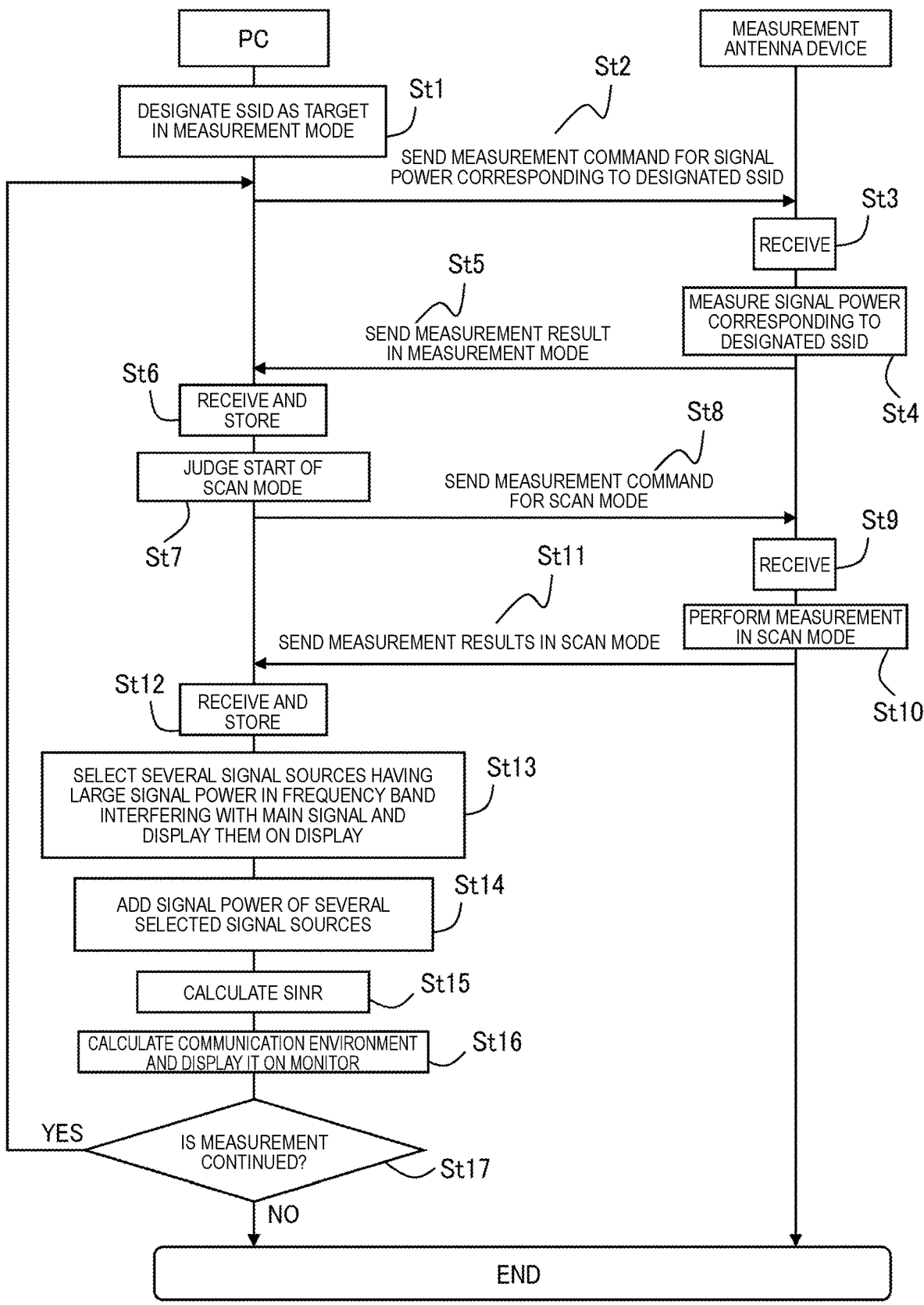
FIG. 6 is a sequence diagram for time-series description of an example operation procedure of measurement of a radio wave environment by the measurement antenna device and the PC which constitute the radio wave environment display system according to the first embodiment.

As described above, in the measurement antenna device 10, switching is made between the measurement mode and the scan mode alternately in a time-divisional manner according to measurement commands sent from the PC 20 (see FIG. 6).

Alternatively, to increase the speed of measurement of radio wave intensity values of radio waves in the measurement antenna device 10, PC 20 may cause the measurement antenna device 10 to measure radio wave intensity values of radio waves using the measurement mode and the scan mode at the same time. More specifically, the PC 20 controls the antenna unit 1 of one surface (e.g., front surface 1PL) of the polyhedron (e.g., hexahedron) constituting the body of the measurement antenna device 10 so that it receives the main signal WV1 and radio waves NZ1-NZ3 transmitted from the various signal sources IF1-IF3. Furthermore, the PC 20 controls the antenna units of the remaining five surfaces (e.g., left surface 2PL, right surface, top surface 5PL, bottom surface, and rear surface) of the polyhedron (e.g., hexahedron) so that they receive the main signal WV1.

The data converter 7a1, which is configured using, for example, a UART (Universal Asynchronous Receiver/Transmitter) circuit, converts parallel-format data that is output from each of the antenna controllers (e.g., antenna controllers 1m-6m) into serial-format data. The resulting data (e.g., signal power values or reception electric field intensity values of radio waves transmitted from the access point AP1 and the various signal sources) is input, via the USB port 7b, to the PC 20 which is connected to the measurement antenna device 10. Alternatively, the resulting data may be input to, instead of the PC 20, a measuring instrument (e.g., spectrum analyzer or network analyzer; not shown) that is connected via the USB port 7b.

The switching controller 7a2 generates, time-divisionally, switching signals for inputting outputs of the horizontally polarized antenna and the vertically polarized antenna installed on each of the surfaces of the measurement antenna device 10 to the MPU 7a. Having a GPIO (General-Purpose Input/Output) terminal, the switching controller 7a2 outputs switching signals (mentioned above) generated time-divisionally to the switch provided on each surface (e.g., each of the switches 1s-6s) via the GPIO terminal. In this manner, switching signals allow an output value of only one of a total of 12 antennas of the measurement antenna device 10 to be input to the MPU 7a exclusively. That is, an output of the horizontally polarized antenna 1h of the antenna unit 1, an output of the vertically polarized antenna 1v of the antenna unit 1, . . . , an output of the horizontally polarized antenna 6h of the antenna unit 6, and an output of the vertically polarized antenna 6v of the antenna unit 6 can be input to the MPU 7a in this order periodically at prescribed intervals.

The USB port 7b connects the measurement antenna device 10 and the PC 20.

Although the above description is directed to the example case that the measurement antenna device 10 receives radio waves, the measurement antenna device 10 may be considered to have a configuration for transmitting radio waves. That is, the radio wave measuring device 10 may perform switching so as to use the antenna units 1-6 time divisionally and, furthermore, transmit radio waves from the horizontally polarized antenna and the vertically polarized antenna of each antenna unit time divisionally.

The measurement antenna device 10 has, as main members, laminated boards as surface members providing the respective surfaces and a frame body provided inside the body of the measurement antenna device 10. The laminated boards and the frame body constitute the body (polyhedron such as a hexahedron) of the measurement antenna device 10. For example, the body of the measurement antenna device 10 assumes a hexahedron; FIG. 3 shows an example case that it assumes a cube. The laminated boards are attached to the respective surfaces of a cube of the frame body by fixing screws 35, for example.

The surface members that constitute the body of the measurement antenna device 10 is not limited to laminated boards. The polyhedron is not limited to a hexahedron and may be a tetrahedron, a dodecahedron, or the like.

In the measurement antenna device 10, antennas (horizontally polarized antenna and vertically polarized antenna) are installed on each of the laminated board that is disposed so as to form the top surface 5PL, the laminated boards that are disposed so as to form the four respective side surfaces (e.g., front surface 1PL, left surface 2PL, right surface, and rear surface), and the laminated board that is disposed so as to form the bottom surface. Configured in this manner, the measurement antenna device 10 can receive radio waves that come in from a total of six directions. Where radio waves are measured with the measurement antenna device 10 fixed to a prescribed mounting surface, the laminated board having antennas may be omitted on the bottom surface of the measurement antenna device 10.

The antennas installed on each laminated board are dipole antennas, for example. The dipole antennas are formed on, for example, the surface of each laminated board and dipole antenna patterns are formed by, for example, etching a metal foil formed on the surface. Each of the plural layers is a copper foil, a glass epoxy layer, or the like.

For example, horizontally polarized antennas 1h-6h that operate in a 1.9 to 2.4 GHz band and vertically polarized antennas 1v-6v that operate in the 1.9 to 2.4 GHz band are installed on the surface (top layer) of each laminated board of the cubic body of the measurement antenna device 10.

An AMC (Artificial Magnetic Conductor) is used to form each laminated board. The AMC is an artificial magnetic conductor having a PMC (Permanent Magnetic Conductor) characteristic and is formed as a prescribed metal pattern. The use of the AMC makes it possible to dispose the antennas of the measurement antenna device 10 parallel with the associated laminated board and thereby reduce the overall size. Furthermore, the AMC can increase the gain of the antennas because reception of radio waves coming from the other directions can be prevented by a ground conductor.

In the measurement antenna device 10, plural grounding via conductors 61 are arranged straightly alongside the edge of each of the four sides of each laminated board. The grounding via conductors 61 may be arranged at the same intervals. Furthermore, the grounding via conductors 61 may be arranged at a pitch (interval) that is long enough to interrupt radio waves coming from outside the measurement antenna device 10. The grounding via conductors 61 are formed so as to penetrate through the laminated board from its top surface to its bottom surface.

Each laminated board of the measurement antenna device 10 is formed so as to assume a rectangular shape, for example. Each side of each laminated board is formed with a recess and a projection that are bounded by one step 71 formed at the center of the side and extend along the side. That is, as shown in FIG. 3, the body of the measurement antenna device 10 is formed by fitting the projection and the recess of one of adjacent laminated boards into and with the recess and the projection of the other, respectively.

The PC 20 which is an example radio wave environment display device is connected to the measurement antenna device 10 by a real cable (e.g., USB cable) and receives radio wave intensity (e.g., signal power or reception electric field intensity) of radio waves received by the measurement antenna device 10. Using the radio wave intensity of the received radio waves, the PC 20 calculates a radio wave environment (e.g., SINR (signal-to-interference-plus-noise ratio); described later)) of a main signal WV1 (see FIG. 1) at the position, where the measurement antenna device 10 is installed, in the target area RG1. Furthermore, the PC 20 calculates a communication environment in the target area RG1 on the basis of the calculated SINR and displays it on the monitor DP1 or a display 18a.

The PC 20 is configured so as to include a processor 11, a ROM 12, a RAM 13, a keyboard 14, a mouse 15, an input/output interface (I/O I/F) 16, an HDD (hard disk drive) 17, the display 18a, and a speaker 18. The ROM 12, the RAM 13, the keyboard 14, the mouse 15, the input/output interface 16, the HDD 17, the display 18a, and the speaker 18 are each connected to the processor 11 by an internal bus or the like so as to be able to exchange data or information with the processor 11.

For example, the processor 11 is configured using a CPU (central processing unit), an MPU (microprocessing unit), a DSP (digital signal processor), or an FPGA (field-programmable gate array). The processor 11, which functions as a controller of the PC 20, performs control processing for controlling the operations of the individual units of the PC 20 in a centralized manner, processing for exchanging data or information with the individual units of the PC 20, data calculation processing, and processing for storing data or information. The processor 11 operates according to programs 17a stored in the HDD 17. Using the ROM 12 and the RAM 13 while it performs processing, the processor 11 outputs calculation result data 17c generated by calculation processing (described later) or display data 17d generated on the basis of the calculation result data 17c to the display 18a and displays the data 17c or 17d on the display 18a.

The processor 11, which is an example selector, selects at least one radio wave intensity measurement result (second measurement result) having a frequency that is the same as or in the vicinity of a frequency (channel) of the first radio wave (main signal WV1) and corresponding to radio waves (see FIG. 1) other than the main signal WV1 from radio wave intensity measurement results (hereinafter referred to "second measurement results") of radio waves obtained from the measurement antenna device 10 in the scan mode.

The processor 11 as an example controller calculates, through calculation processing, the difference (what is called SINR) between a measurement result (hereinafter referred to as a "first measurement result") of radio wave intensity of a main signal WV1 at the installation position of the measurement antenna device 10 and the selected second measurement result. The processor 11 calculates a communication environment in the target area RG1 on the basis of the calculated difference (SINR) and displays it on the monitor DP1 and/or the display 18a. For example, where calculation base data 17b includes a table in which numerical values of SINRs and those of communication environments are correlated with each other in advance, the processor 11 calculates a communication environment corresponding to the calculated SINR by referring to the table.

Where the target area RG1 is a such a place that persons to enter there are required to be given strict security clearance, if judging on the basis of the second measurement result that the radio wave intensity of radio waves transmitted from a mobile router that is not the access point having the prescribed SSID that is registered in advance so as to be usable in the target area RG1 is higher than a threshold value, the processor 11 may display, on the display 18a, information to the effect that an SSID of that mobile router has been detected. With this measure, the PC 20 can visually present, to the system operator, the fact that, for example, a non-prescribed access point (i.e., mobile router) has been brought to the target area RG1 and thereby strengthen watching of the target area RG1.

The ROM 12, which is a read-only memory, is stored with OS (operating system) programs and data in advance. The OS programs are executed upon a start of the PC 20.

The RAM 13, which is a writable and readable memory, is used as a work memory during SINR and communication environment calculation processing (see FIGS. 6 and 9) and temporarily holds data or information that is used or generated at the time of SINR and communication environment calculation processing.

The keyboard 14 and the mouse 15, which are example manipulation input devices, function as human interfaces with the system operator and receives manipulations of the system operator. In other words, the keyboard 14 and the mouse 15 are used for making various settings for various kinds of processing to be performed by the PC 20.

The input/output interface 16, which is an example receiver, operates as an interface for performing input/output of data or information with the measurement antenna device 10. The input/output interface 16 receives, from the measurement antenna device 10, radio wave intensity measurement result (first measurement result) including a frequency of a main signal WV1 that is transmitted from the access point AP1 (see FIG. 1) corresponding to radio identification information designated by the system operator and sends it to the processor 11. The input/output interface 16 receives, from the measurement antenna device 10, radio wave intensity measurement results including frequencies (second measurement results) of various kinds of radio waves including a main signal WV1 (mentioned above) and sends them to the processor 11.

The HDD 17 stores the programs 17a for execution of SINR and communication environment calculation processing (see FIGS. 6 and 9), calculation base data 17b to be used for the SINR and communication environment calculation processing, calculation result data 17c corresponding to results of the SINR and communication environment calculation processing, and display data 17d generated on the basis of the calculation result data 17c. The calculation base data 17b includes, for example, information of a formula or a table to be used for calculating each of an SINR and a communication environment, data of maps or layouts of target areas RG1, RG2, and RG3 (described later), information relating to radio waves transmitted from various signal sources, traveling through the target area RG1, and to be received by the communication device 19, and information relating to the access point AP1 corresponding to the desired radio identification information of the system operator.

The programs 17a for execution of SINR and communication environment calculation processing are read out from the HDD 17 into the RAM 13 via the processor 11 and run by the processor 11. Alternatively, the programs 17a may be recorded in a recording medium (e.g., CD-ROM; not shown) other than the HDD 17 and read into the RAM 13 by a corresponding reading device (e.g., CD-ROM driving device; not shown).

The display 18a, which is an example display or output device, is configured using a display device such as an LCD (liquid crystal display) or an organic EL (electroluminescence) display. Having a function of human interfacing with the system operator, the display 18a displays details of various settings, an operation state of the PC 20, various calculation results, and display data 17d corresponding to calculation results.

The speaker 18b, which is an example output device, outputs a prescribed sound (e.g., alarm sound) in response to an instruction from the processor 11 when it is judged that a radio wave intensity of radio waves transmitted from a mobile router that is not the access point having the prescribed SSID that is registered in advance as an SSID usable in the target area RG1 is higher than the threshold value. The prescribed sound is an alarm sound indicating that a mobile router that is not the access point having the prescribed SSID that is registered in advance as an SSID usable in the target area RG1 has been brought there.

The communication device 19 receives radio waves being transmitted (i.e., traveling) through the target area RG1 where the PC 20 is disposed, extracts pieces of information relating to radio wave intensity (e.g., signal power or reception electric field intensity), a frequency, and a signal source (e.g., the SSID corresponding to the access point AP1) of the received radio waves using known techniques, for example, and outputs the extraction results to the processor 11. The extraction results are displayed on the display 18a by the processor 11 in the form of a radio wave list of radio waves received by the PC 20.

Figure 4A:
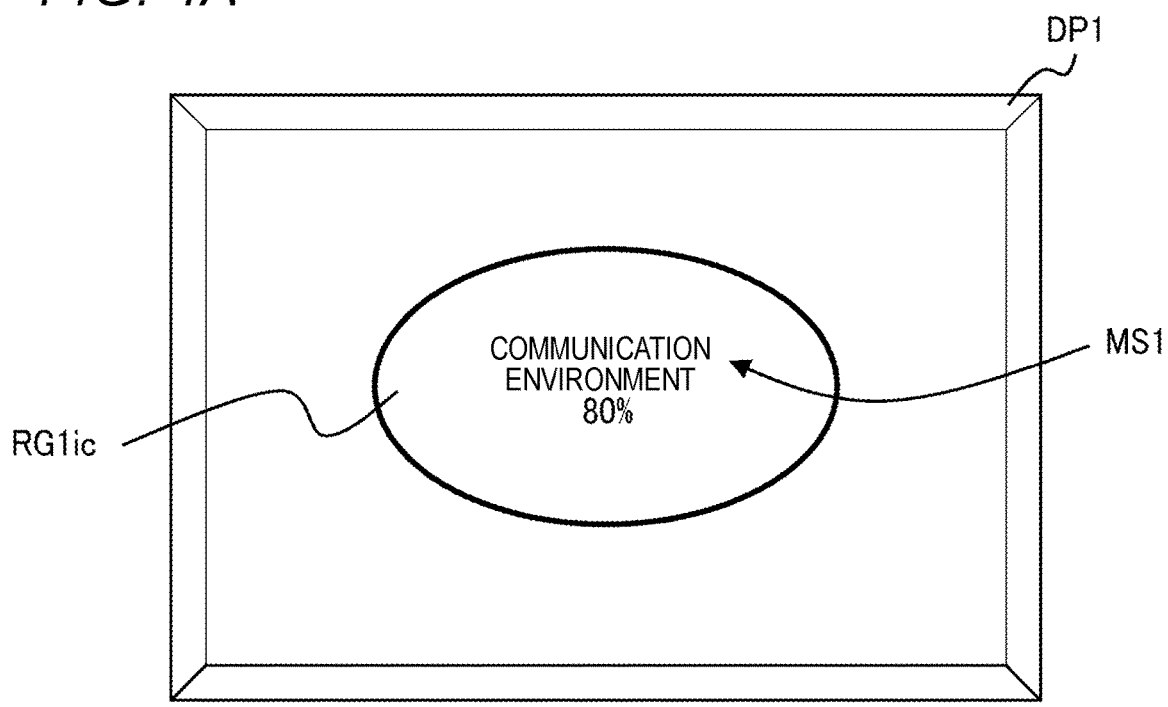
FIG. 4A is a diagram showing an example display of a calculation result of a communication environment in the target area.
Figure 4B:
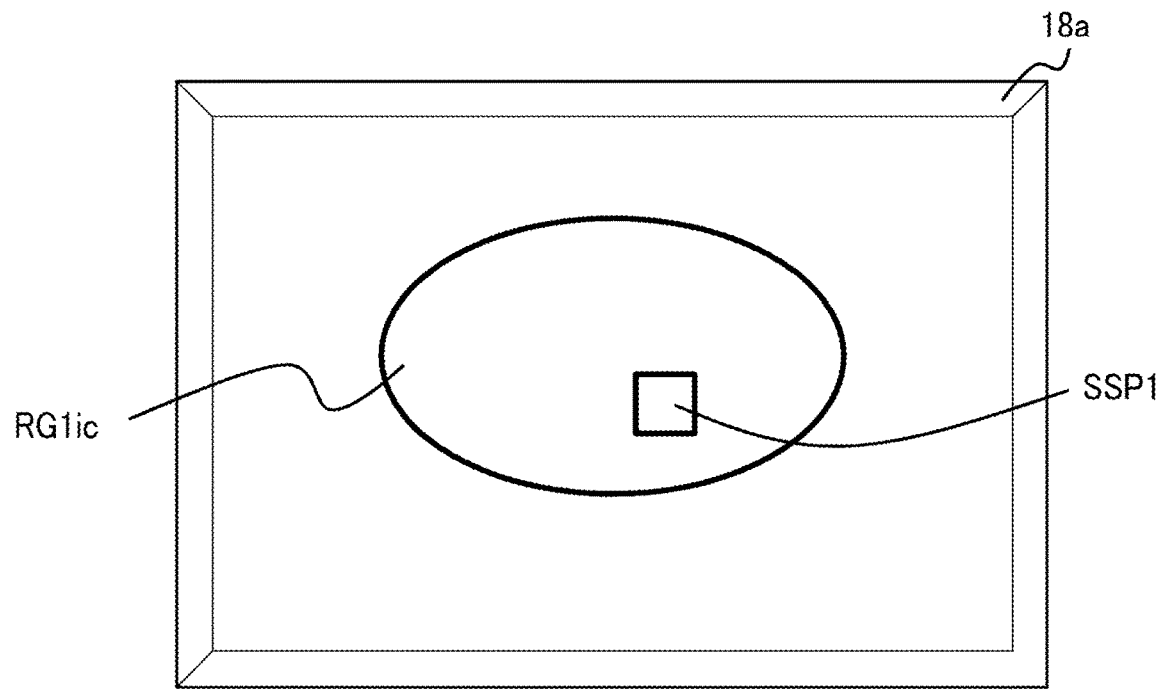
FIG. 4B is a diagram showing an example display of an announcement picture indicating that a non-prescribed access point has been brought to the target area.
Figure 5:
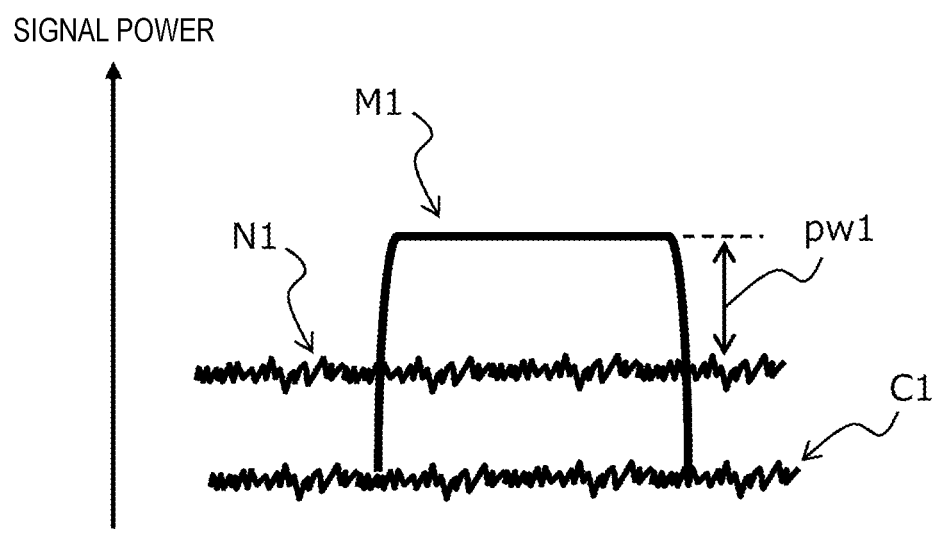
FIG. 5 is a graph showing example signal power values of a main signal, disturbing waves, and stationary waves.

Next, an operation of measuring radio wave intensity (in other words, reception quality) of a main signal WV1 in the radio wave environment display system 100 according to the first embodiment will be outlined with reference to FIGS. 4A, 4B, and 5. FIG. 4A is a diagram showing an example display of a calculation result of a communication environment in the target area RG1. FIG. 4B is a diagram showing an example display of an announcement picture indicating that a non-prescribed access point has been brought to the target area RG1. FIG. 5 is a graph showing example signal power values of a main signal WV1, disturbing waves, and stationary waves.

As described above with reference to FIG. 1, the measurement antenna device 10 is disposed above the counter CNT1 (e.g., check-in counter) in the target area RG1. The horizontally polarized antennas 1h, 2h, . . . , 5h, and 6h (not shown) and the vertically polarized antenna 1v, 2v, . . . , 5v, and 6v (not shown) installed on the respective surfaces of the hexahedral body of the measurement antenna device 10 receive, in addition to a main signal WV1 transmitted from the access point AP1, kinds of radio waves (i.e., disturbing waves NZ1-NZ3) transmitted from the signal sources IF1-IF3.

The access point AP1 is a radio transmitter that is installed in the airport ARP1 to provide a wireless LAN service free of charge and transmits a radio signal (i.e., main signal WV1) having a frequency corresponding to the radio identification information (e.g., SSID) designated by the system operator. The main signal WV1 is a signal that complies with a wireless LAN such as WiFi (registered trademark). The signal sources IF1-IF3 are radio transmitters that transmit signals (i.e., disturbing waves) that have frequencies the same as or in the vicinities of frequencies of the main signal WV1 (in other words, frequencies that are the same as all or part of the frequencies of the main signal WV1) and hence may interfere with the main signal WV1. For example, the radio waves NZ1-NZ3 are disturbing radio waves transmitted (radiated) from mobile routers being carried by travelers who have appeared in the target area RG1 and being compatible with wireless LANs.

For example, where the main signal WV1 has frequencies of a wireless LAN (e.g., 2.4-GHz band), the radio waves NZ1-NZ3 that are disturbing waves are also radio signals of wireless LANs (e.g., 2.4-GHz band). The radio waves NZ1-NZ3 may be a combination of radio signals of a wireless LAN, Bluetooth (registered trademark), and DECT instead of a combination of wireless LANs.

As shown in FIG. 4A, image data generated in such a manner that a message MS1 indicating a quantitative communication environment (e.g., 80%) in the target area RG1 calculated by the PC 20 is superimposed on an image RG1ic indicating a shape of the target area RG1 is displayed on the monitor DP1 as example display data 17d. As a result, seeing the image data being displayed in the image that coincides with the target area RG1 in shape, travelers etc. existing in the target area RG1 can recognize, more visually, whether the current communication environment of the wireless LAN service in the target area RG1 is good. In other words, the PC 20 can inform travelers etc. existing in the target area RG1, more visually, that the current communication environment of the wireless LAN service is as good as 80% and hence urge users to use the wireless LAN service to increase the convenience of the users.

On the other hand, assume that the PC 20 has judged that the radio wave intensity of radio waves transmitted from a mobile router that is not the access point AP1 having the prescribed SSID that is registered in advance so as to be usable in the target area RG1 is higher than the threshold value. In this case, as shown in FIG. 4B, image data generated by superimposing an icon SSP1 generated by the PC20 and indicating an SSID of the mobile router on an image RG1ic indicating a shape of the target area RG1 is displayed on the display 18a as example display data 17d. As such, the PC 20 can inform the system operator visually that, for example, a non-prescribed access point (i.e., mobile router) has been brought to the target area RG1, whereby watching of the target area RG1 can be strengthened.

As shown in FIG. 5, signal power M1 of a main signal WV1 is larger than signal power N1 that is the sum of signal power values of radio waves NZ1-NZ3 that are disturbing waves and signal power C1 of stationary waves (noise) existing stationarily in the target area RG1. To facilitate understanding of the description, it is assumed that in FIG. 5 the signal power is in decibel.

Incidentally, it would be inappropriate to use the magnitude of the signal power M1 itself of the main signal WV1 shown in FIG. 5 as radio wave intensity in the target area RG1 where the measurement antenna device 10 is installed. This is because the magnitude of the signal power M1 of the main signal WV1 is decreased being affected by the signal power values of the radio waves NZ1-NZ3 that are disturbing waves that interfere with the main signal WV1. In view of this, the PC 20 employed in the first embodiment calculates, as a radio wave environment (e.g., SINR) in the target area RG1 where the signal power M1 of the main signal WV1 has been obtained, signal power pw1 by subtracting the magnitude of the sum of the signal power values of the radio waves NZ1-NZ3 that are disturbing waves from the magnitude of the signal power M1 of the main signal WV1. Alternatively, signal power pw1 may be calculated by subtracting an average value, over a prescribed time, of the magnitude of the sum of the signal power values of radio waves NZ1-NZ3 from an average value, over the prescribed time, of the magnitude of the signal power M1 of the main signal WV1.

Next, an operation procedure of measurement of a radio wave environment in the radio wave environment display system 100 according to the first embodiment will be described with reference to FIG. 6. FIG. 6 is a sequence diagram for time-series description of an example operation procedure of measurement of a radio wave environment by the measurement antenna device 10 and the PC 20 which constitute the radio wave environment display system 100 according to the first embodiment. It is assumed for the description to be made with reference to FIG. 6 that the measurement antenna device 10 is installed above a desk of the counter CNT1 provided in the target area RG1, the communication device 19 of the PC 20 receives radio waves being transmitted through the target area RG1, and the PC 20 displays on the display 18a, in the form of a radio wave list, extraction results of pieces of information relating to radio wave intensity, a frequency, and a signal source of the received radio waves.

Referring to FIG. 6, the PC 20 receives designation of radio identification information (e.g., SSID) of the access point AP1 corresponding to a main signal WV1 that is a target in the measurement mode, the designation being made by the system operator from a radio wave list displayed on the display 18a by a manipulation using the keyboard 14 or the mouse 15 (SU). The PC 20 generates a measurement command for the measurement mode in which to measure signal power of a main signal WV1 that is transmitted from the access point AP1 corresponding to the SSID designated at step St1, and sends the generated measurement command to the measurement antenna device 10 (St2).

The measurement antenna device 10 receives the measurement command that was sent from the PC 20 at step St2 (St3), and measures, in the measurement mode, radio wave intensity (e.g., signal power) of a main signal WV1 transmitted from the access point AP1 corresponding to the SSID indicated by the measurement command at the installation position of the counter CNT1, where the device 10 is installed, in the target area RG1 (St4). The measurement antenna device 10 sends, to the PC 20, a result (first measurement result) of the measurement of signal power of the main signal WV1 that was made in the measurement mode at step St4 (St5).

The PC 20 receives the first measurement result sent from the measurement antenna device 10 at step St5 and stores it in the HDD 17 (St6).

After the execution of step St6, the PC 20 terminates the measurement mode and judges that the scan mode should be started (St7). The PC 20 generates a measurement command for the scan mode in which to measure signal power values of a main signal WV1 and various radio signals (e.g., main signal WV1 and radio waves NZ1-NZ3 (disturbing waves) shown in FIG. 1) and sends the generated measurement command to the measurement antenna device 10 (St8).

The measurement antenna device 10 receives the measurement command that was sent from the PC 20 at step St8 (St9), and measures, in the scan mode, signal power values of all radio signals (e.g., main signal WV1 and radio waves NZ1-NZ3 (disturbing waves)) designated by the measurement command at the installation position of the counter CNT1, where the device 10 is installed, in the target area RG1 (St10). The measurement antenna device 10 sends, to the PC 20, results (second measurement results) of the measurement of signal power values of all the radio signals that was made in the scan mode at step St10 (St11).

The PC 20 receives the second measurement results that were sent from the measurement antenna device 10 at step St11 and stores them in the HDD 17 (St12). The PC 20 selects plural (e.g., two or three) signal sources each of which transmitted (radiated) a radio signal having frequencies the same as or in the vicinity of frequencies (channel) of the main signal WV1 received at step St6 (in other words, frequencies at which interference with the main signal WV1 occurs) from the second measurement results received at step St12 (St13).

Where the target area RG1 is a place where persons to enter there are required to be given strict security clearance, if judging that the radio wave intensity of radio waves transmitted from a mobile router that is not the access point AP1 having the prescribed SSID that is registered in advance so as to be usable in the target area RG1 is higher than the threshold value, the PC 20 may display, on the display 18a, information to the effect that an SSID of that mobile router has been detected (see FIG. 4) (St13). The PC 20 may cause the speaker 18b to emit an alarm sound bearing information to the effect that a non-prescribed mobile router has been detected.

The PC 20 adds together signal power values of the plural signal sources selected at step St13 (St14), and performs calculation processing to calculate the difference between the signal power of the main signal WV1 stored in the HDD 17 at step St6 and the addition result of the signal power values obtained at step St14 (i.e., SINR shown in FIG. 5) as a radio wave environment in the target area RG1 where the measurement antenna device 10 is installed (St15). The PC 20 calculates, quantitatively, a communication environment of the wireless LAN service in the target area RG1 on the basis of the SINR calculated by the calculation processing performed at step St15, and displays the calculated communication environment on the monitor DP1 (St16; see FIG. 4A). The PC 20 may display the calculated communication environment on the display 18a.

After the execution of step St16, if the user wants to continue to measure an SINR of the same main signal WV1 in the target area RG1 (St17: yes), the process of the PC 20 returns to step St2. On the other hand, if the user does not want to continue to measure an SINR of the same main signal WV1 in the target area RG1 (St17: no), the execution of the process of FIG. 6 is finished.

As described above, the radio wave environment display system 100 according to the first embodiment is equipped with the measurement antenna device 10 which is installed in the target area RG1 of the radio LAN service (example wireless communication service) that is provided in the airport ARP1 so as to be usable free of charge, and the PC 20 which analyzes a communication environment of the wireless LAN service using radio wave intensity of radio waves received by the measurement antenna device 10. The measurement antenna device 10 measures radio wave intensity of a main signal WV1 (an example first radio wave) transmitted through the target area RG1 by the wireless communication service, and scans radio wave intensity values of the plurality of radio waves including the main signal WV1 in the target area RG1. The PC 20 selects radio wave intensity of radio waves (example second radio waves) having a frequency that is the same as or in the vicinity of a frequency of the main signal WV1 among the plurality of radio waves obtained by the scan. The PC 20 calculates a communication environment of the wireless LAN service on the basis of the difference (i.e., SINR) between the selected radio wave intensity of the main signal WV1 and the radio wave intensity of the second radio waves, and displays the calculated communication environment on the monitor DP1.

With this configuration, in the radio wave environment display system 100, the PC 20 can calculate a proper radio wave environment (e.g., SINR) eliminating influences of disturbing waves existing in the target area RG1 in measuring a radio wave environment for the desired radio wave (main signal WV1) transmitted from the access point AP1 and traveling through the target area RG1. As a result, the PC 20 can visually present, on the monitor DP1, whether a latest communication environment of a wireless communication service provided in an airport, a train station, or the like so as to be usable by travelers etc. free of charge is good and hence suppress lowering of the ease of use of users of the wireless LAN service effectively.

For example, where the magnitude of signal power of only the main signal WV1 is employed as it is as a radio wave environment at the installation location of the measurement antenna device 10 in the target area RG1, if there exists disturbing waves that may interfere with the main signal WV1 strongly, the signal power of the main signal WV1 may deteriorate to a large extent being affected by the disturbing waves. That is, even if the signal power of the main signal WV1 is large, the SINR at the position concerned becomes small if disturbing waves have large signal power, possible causing an event that data transmitted from another wireless communication device (not shown) cannot be demodulated at that position and the communication quality is lowered. In the first embodiment, since an SINR obtained by not only using signal power of the main signal WV1 but also taking influences of disturbing waves and noise into consideration is used as a radio wave environment, the PC 20 allows a user to properly judge whether the communication environment of a wireless communication at the position concerned is superior on the basis of a quantitative communication environment displayed on the monitor DP1.

The PC20 displays the communication environment of the wireless LAN service in an image indicating a shape of the target area RG1. With this measure, seeing image data displayed in an image that coincides with the target area RG1 in shape, travelers etc. existing in the target area RG1 can recognize, more visually, whether the current communication environment of the wireless LAN service in the target area RG1 is good. In other words, capable of informing, more visually, travelers etc. existing in the target area RG1 that the current communication environment of the wireless LAN service is as good as 80%, the PC 20 can urge users to use the wireless LAN service and hence increase the ease of use of the users.

If radio wave intensity values of the plurality of second radio waves are selected, the PC 20 causes the processor 11 to calculate a communication environment quantitatively on the basis of the difference between the radio wave intensity of the main signal WV1 and the sum of the radio wave intensity values of radio waves NZ1-NZ3 that are plural kinds of disturbing waves. With this measure, even in a case that plural kinds of disturbing waves that may interfere with the main signal WV1 exist in the vicinity of the counter CNT1 in the target area RG1 where the measurement antenna device 10 is installed, the PC 20 can properly calculate and display a communication environment of the wireless LAN service taking signal power values of the plural kinds of disturbing waves into consideration.

The measurement antenna device 10 has a polyhedral body on surfaces on which respective antennas are installed, and uses the antennas installed on the respective surfaces time-divisionally (e.g., at intervals of one minute) in such a manner as to perform measurement of radio wave intensity of the main signal WV1 and measurement of radio wave intensities of the plurality of radio waves including the main signal WV1 alternately. With this measure, the measurement antenna device 10 can alternately perform measurement of radio wave intensity of the main signal WV1 and measurement of radio wave intensities of the plurality of radio waves including the main signal WV1 at respective prescribed cycles.

The measurement antenna device 10 has a polyhedral body on surfaces on which respective antennas are installed, and among the antennas installed on the respective surfaces, uses an antenna installed on at least one surface of the polyhedral body for measurement of a radio wave environment for the plural of radio waves and uses the antennas installed on the remaining surfaces of the polyhedral body for measurement of a radio wave environment for the main signal WV1. With this measure, since the PC 20 can perform a measurement of various kinds of radio waves including the main signal WV1 traveling through the target area RG1 in the scan mode in the same period as in the measurement mode, it is not necessary to perform measurement in the measurement mode and measurement in the scan mode individually and hence a communication environment can be calculated quickly.

Furthermore, when having detected presence of radio waves other than the prescribed main signal WV1 in the target area (that is, radio waves that are not expected (permitted) to exist in the target area RG1), the PC 20 outputs information indicating that radio waves other than the main signal WV1 exist to the display 18a and/or the speaker 18b. With this measure, the PC 20 can visually inform the system operator that a non-prescribed access point (i.e., mobile router) has been brought to the target area RG1, whereby watching of the target area RG1 can be strengthened.

Embodiment 2

In a second embodiment, in addition to the features of the first embodiment, the radio wave environment display system 100 according to the first embodiment is installed in other target areas, where the same wireless LAN service as provided in the first embodiment can be used, in an airport, a train station, or the like. The PC 20 of the radio wave environment display system 100 installed in each target area calculates a communication environment in the target area in which itself is installed, and receives pieces of data or information transmitted from the PCs of the radio wave environment display systems installed in the other target areas and indicating communication environments there and displays them on the monitor installed in the associated target area.

Since each radio wave environment display system 100 according to the second embodiment is the same in configuration as the radio wave environment display system 100 according to the first embodiment, constituent elements having the same ones in the first embodiment will be given the same reference symbols as the latter and will be described in a simplified manner or will not be described at all; only differences will be described.

Figure 7:
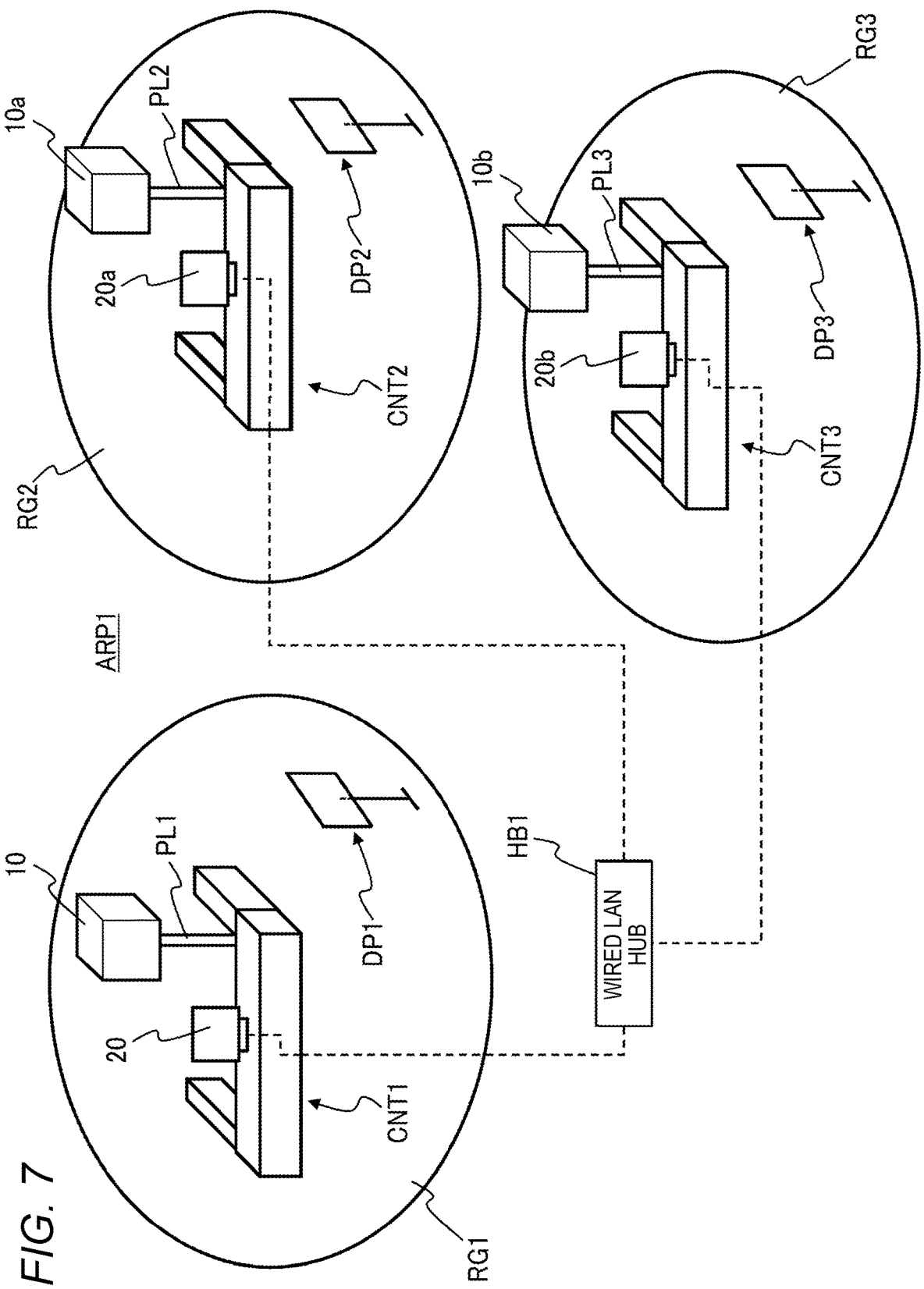
FIG. 7 is a diagram showing plural example target areas including airport counters where measurement antenna devices employed in the second embodiment are installed, respectively.

First, target areas where the respective radio wave environment display systems 100 employed in the second embodiment are installed will be described with reference to FIG. 7. FIG. 7 is a diagram showing plural example target areas RG1, RG2, and RG3 including airport counters CNT1, CNT2, and CNT3 where measurement antenna devices 10, 10a, and 10b employed in the second embodiment are installed, respectively. Since the target area RG1 was described with reference to FIG. 1, the same items as already described will be described in a simplified manner or will not be described at all; only differences will be described.

As shown in FIG. 7, the counters CNT2 and CNT3 where, for example, many travelers are to gather for check-in in the airport ARP1 are installed in the respective target areas RG2 and RG3. For example, the measurement antenna devices 10a and 10b are supported by poles PL2 and PL3 from desk surfaces of the counters CNT2 and CNT3, respectively, and are installed permanently. PCs 20a and 20b having the same configuration as the PC 20 employed in the first embodiment are installed on the desks of the counters CNT2 and CNT3, respectively. The manner of installation of the measurement antenna devices 10a and 10b is not limited to supporting them by the poles PL2 and PL3; for example, the measurement antenna devices 10a and 10b may be installed so as to hang down from ceiling surfaces (not shown) over the counters CNT2 and CNT3 using cords, respectively.

Also in the target areas RG2 and RG3, the first radio wave (main signal WV1) is being transmitted (radiated) from an access point AP1 that is compatible with a desired wireless LAN service such as WiFi (registered trademark) that is provided so as to be usable by travelers etc. free of charge in the airport ARP1. The measurement antenna devices 10a and 10b receive the main signal WV1 in the measurement mode, measure radio wave intensities of the main signal WV1 at the time of its reception, and outputs the measured radio wave intensities to the corresponding PCs 20a and 20b. Furthermore, in the scan mode, each of the measurement antenna devices 10a and 10b receives a plurality of radio waves including a main signal WV1 existing in the target areas RG2 and RG3, measures radio wave intensity values of the main signal WV1 at the time of reception of each of the radio waves, and outputs the measured radio wave intensity values to the corresponding PC 20a or 20b. Each of the PCs 20a and 20b calculates a communication environment of the wireless LAN service in the target area RG2 or RG3 and outputs the calculated communication environment to the monitor DP2 or DP3. The monitors DP2 and DP3 are large-size displays installed in, for example, the target areas RG2 and RG3 at such positions as to be able to be seen by many travelers easily.

Each of the PCs 20, 20a, and 20b installed in the respective target areas RG1-RG3 generates display data 17d indicating radio wave intensity values calculated in the target area where itself is installed and sends it to the other PCs. The PCs 20, 20a, and 20b are connected to each other via a wired LAN hub HB1 in such a manner that wired communication of data or information can be performed via the wired LAN hub HB1. Each of the measurement antenna devices 10, 10a and 10b switches to the measurement mode or the scan mode in response to a mode switching signal (in other words, measurement command (described later)) sent from the corresponding PC 20, 20a, or 20b, for example.

Figure 8A:
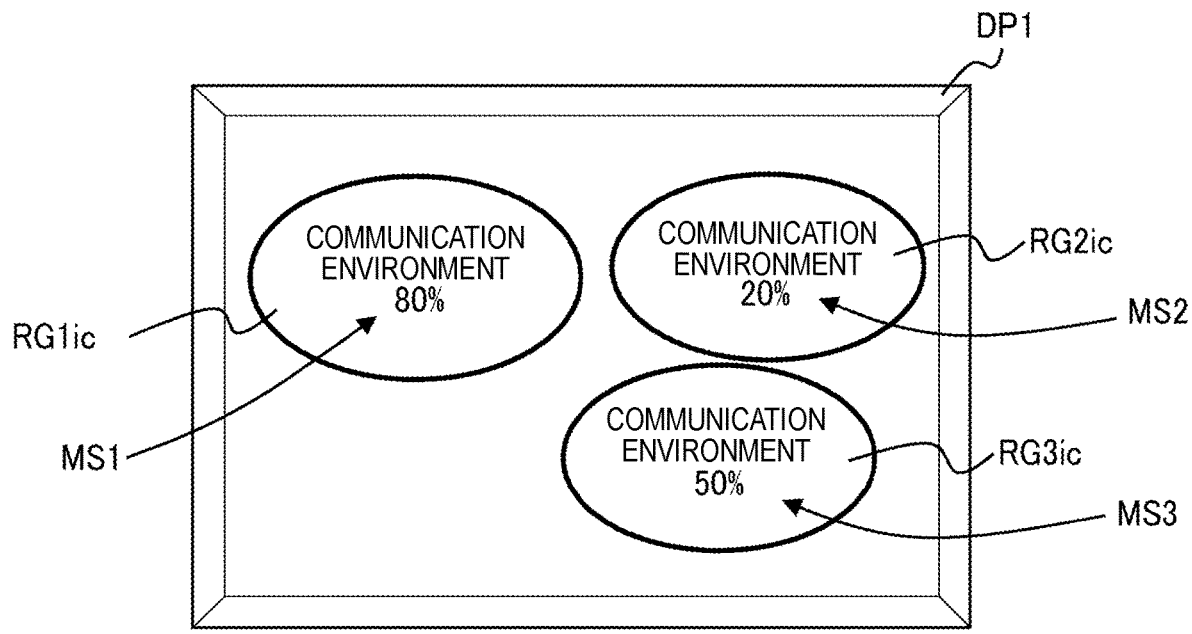
FIG. 8A is a diagram showing an example display of calculation results of communication environments in the respective target areas.
Figure 8B:
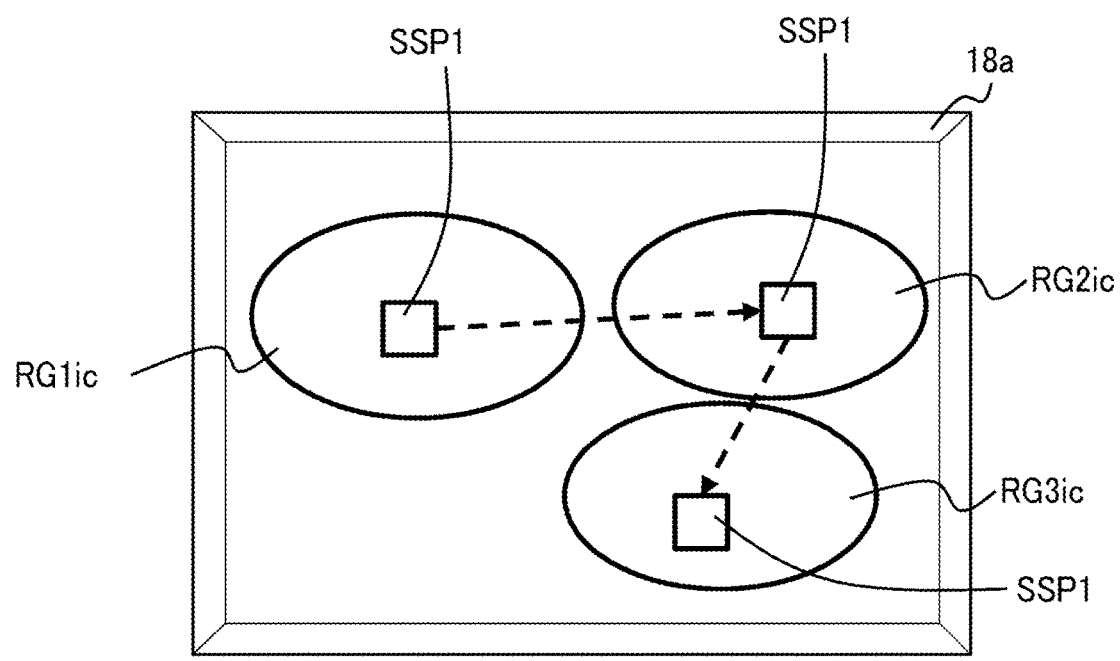
FIG. 8B is a diagram showing an example display of an announcement picture indicating that a non-prescribed access point has been brought to the target areas.

Next, an example of how communication environments are displayed in each radio wave environment display system 100 according to the second embodiment on the basis of radio wave intensity values (in other words, reception quality values) of a main signal WV1 will be described with reference to FIGS. 8A and 8B. FIG. 8A is a diagram showing an example display of calculation results of communication environments in the respective target areas RG1-RG3. FIG. 8B is a diagram showing an example display of an announcement picture indicating that a non-prescribed access point has been brought to the target areas RG1-RG3.

As shown in FIG. 8A, image data generated by superimposing messages MS1, MS2, and MS3 indicating quantitative communication environments (e.g., 80%, 20%, and 50%) in the target areas RG1, RG2, and RG3 calculated by the PCs 20, 20a, and 20b on images RG1ic, RG2ic, and RG3ic indicating shapes of the target areas RG1, RG2, and RG3, respectively, is displayed on the monitor DP1 as example display data 17d. The image data shown in FIG. 8A may also be displayed in each of the monitors DP2 and DP3. As a result, seeing the image data being displayed in the images that coincide with the target areas RG1, RG2, and RG3 in shape, respectively, travelers etc. existing in the target areas RG1, RG2, and RG3 can recognize, more visually, whether the communication environments of the wireless LAN service in the current target areas RG1, RG2, and RG3 are good. In other words, the PCs 20, 20a, and 20b can indicate, more visually, that the current communication environment of the wireless LAN service in the target area RG1 is as good as 80%, the current communication environment of the wireless LAN service in the target area RG2 is as poor as 20%, and the current communication environment of the wireless LAN service in the target area RG3 is as a little good as 50%, and hence urge users to use the wireless LAN service to increase the convenience of the users.

On the other hand, assume that each of the PCs 20, 20a, and 20b has judged that the radio wave intensity of radio waves transmitted from a mobile router that is not the access point AP1 having the SSID that is registered in advance so as to be usable in each of the target areas RG1, RG2, and RG3 is higher than the threshold value. In this case, as shown in FIG. 8B, image data generated by superimposing an icon SSP1 generated by the PC20, 20a, or 20b and indicating an SSID of the mobile router on an image RG1ic, RG2ic, and RG3ic indicating shapes of the target area RG1, RG2, and RG3 is displayed on the display 18a as example display data 17d. Broken lines shown in FIG. 8B indicate time-series movement loci of the mobile router, that is, the mobile router has moved in order of target area RG1→target area RG2→target area RG3, for example. In displaying the image shown in FIG. 8B, each of the PCs 20, 20a, and 20b may display, in the vicinity of the icon SSP1, a time when the radio wave intensity of radio waves was judged higher than the threshold value. As such, each of the PCs 20a, 20a, and 20b can inform the system operator visually that a non-prescribed access point (i.e., mobile router) has been brought to the target areas RG1, RG2, and RG3 in order of target area RG1→target area RG2→target area RG3, for example, whereby watching of the target areas RG1-RG3 can be strengthened.

Figure 9:
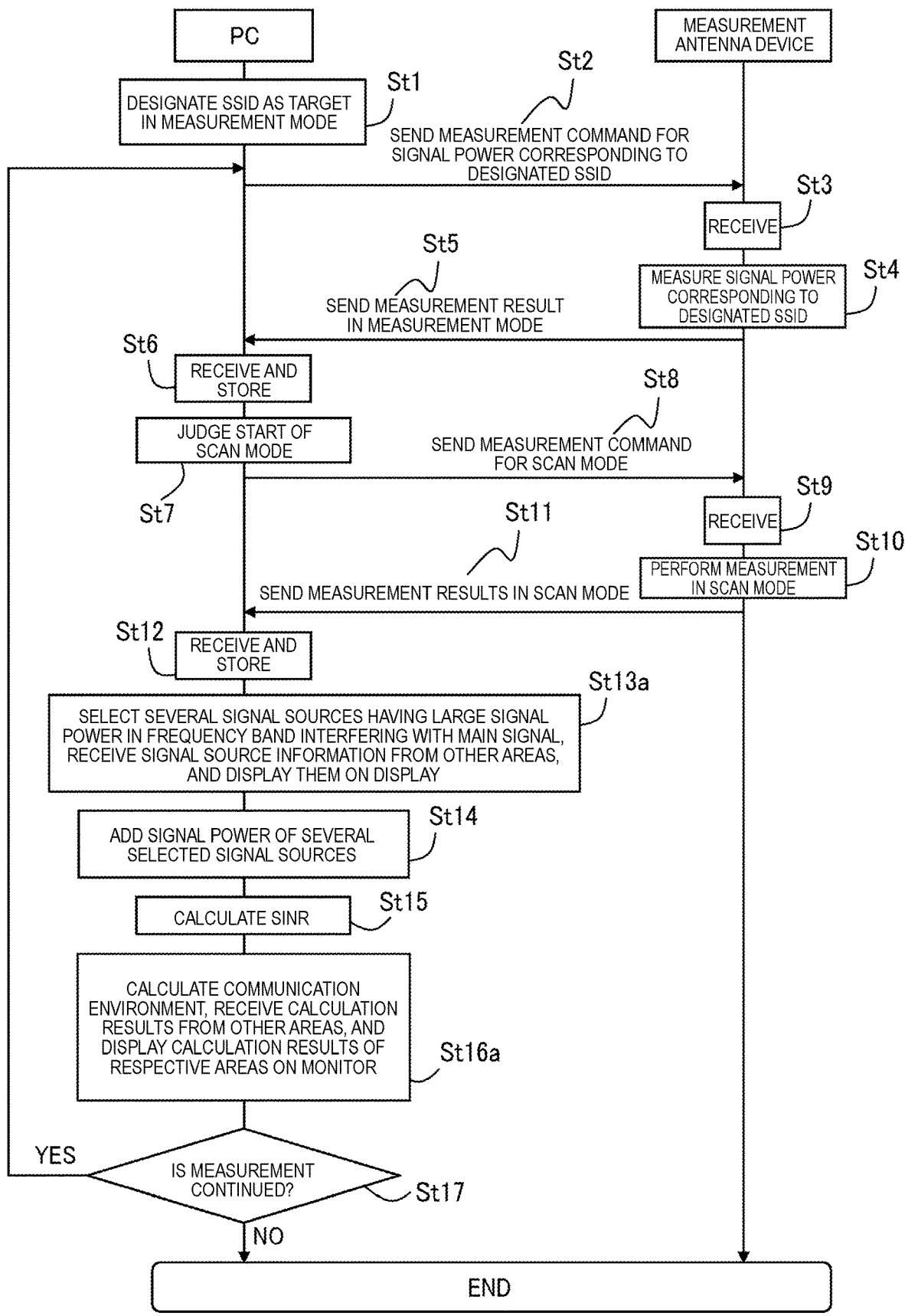
FIG. 9 is a sequence diagram for time-series description of an example operation procedure of measurement of a radio wave environment by the measurement antenna device and the PC which constitute each radio wave environment display system according to the second embodiment.

Next, an operation procedure of measurement of a radio wave environment in each radio wave environment display system 100 according to the second embodiment will be described with reference to FIG. 9. FIG. 9 is a sequence diagram for time-series description of an example operation procedure of measurement of a radio wave environment by the measurement antenna device 10 and the PC 20 which constitute each radio wave environment display system 100 according to the second embodiment. Although an operation of the measurement antenna device 10 of the measurement antenna devices 10, 10a, and 10b and an operation of the PC 20 of the PCs 20, 20a, and 20b will be described as examples with reference to FIG. 9, the other measurement antenna devices 10a and 10b and the other PCs 20a and 20b operate in the same manners. In the description to be made with reference to FIG. 9, steps having the same ones in FIG. 6 will be given the same step numbers as the latter and will be described in a simplified manner or will not be described at all; only differences will be described.

Referring to FIG. 9, if the other PCs 20a and 20b have judged that the radio wave intensity of radio waves transmitted from a mobile router that is not the access point AP1 having the prescribed SSID that is registered in advance so as to be usable in the other target areas RG2 and RG3, the PC 20 receives information (signal source information) relating to the mobile router (St13a). The PC 20 generates a picture in which an icon SSP1 indicating an SSID of the mobile router is superimposed on images RG1ic, RG2ic, and RG3ic indicating shapes of the target areas RG1, RG2, and RG3 and displays the generated picture on the display 18a (St13a; see FIG. 8B).

After executing step St15, the PC 20 calculates, quantitatively, a communication environment of the wireless LAN service in the target area RG1 on the basis of an SINR calculated by calculation processing at step St15 (St16a). Likewise, the other PCs 20a and 20b calculate, quantitatively, communication environments of the wireless LAN service in the other target areas RG2 and RG3 on the basis of SINRs calculated in the target areas RG2 and RG3 and sends the calculated communication environments to the PC 20. The PC 20 receives the communication environment calculation results transmitted from the other PCs 20a and 20b (St16a). The PC 20 generates a picture in which messages MS1, MS2, and MS3 indicating quantitative communication environments (e.g., 80%, 20%, and 50%) in the target areas RG1, RG2 and RG3 are superimposed on images RG1ic, RG2ic, and RG3ic indicating shapes of the target areas RG1, RG2 and RG3, respectively, and displays the generated picture on the monitor DP1 (St16a; see FIG. 8A). The steps following step St16a are the same as those shown in FIG. 6 and hence will not be described.

As described above, in each radio wave environment display system 100 according to the second embodiment, the PC 20 installed in each target area receives data or information of a communication environment of the wireless communication service calculated on the basis of radio wave intensity values of various kinds of radio waves including the main signal WV1 (e.g., radio waves NZ1-NZ3 as disturbing waves) measured in other target areas. The PC 20 installed in each target area displays the communication environment of the wireless communication service in the target area (e.g., target area RG1) where itself is installed and the communication environments of the wireless communication service in the other target areas (e.g., target areas RG2 and RG3) on the display device (e.g., the monitor DP1) in such a manner that they are adjacent to each other.

With this measure, in measuring a radio wave environment for the desired radio wave (main signal WV1) transmitted from the access point AP1 that is transmitting the radio waves through the target areas RG1, RG2, and RG3, each of the PCs 20, 20a, and 20b can calculate a radio wave environment (e.g., SINR) properly by eliminating influences of disturbing waves existing in the target area RG1, RG2, or RG3. As a result, each of the PCs 20, 20a, and 20b can visually present, on the monitor DP1, DP2, or DP3, whether a latest communication environment of a wireless communication service provided in an airport, a train station, or the like so as to be usable by travelers etc. free of charge is good and hence suppress lowering of the ease of use of users of the wireless LAN service effectively. Furthermore, capable of presenting current communication environments of the wireless LAN service in the target areas RG1, RG2, and RG3 of the airport ARP1 together visually to travelers etc. existing in the target area RG1, RG2, or RG3, each of the PCs 20, 20a, and 20b can urge users to use the wireless LAN service and thereby increase the ease of use of the users.

The present application is based on Japanese Patent Application No. 2018-075634 filed on Apr. 10, 2018, the disclosure of which is invoked herein by reference.

Although the various embodiments have been described above with reference to the drawings, it goes without saying that the disclosure is not limited to those examples. It is apparent that those skilled in the art could conceive various changes, modifications, replacements, additions, deletions, or equivalents within the confines of the claims, and they are naturally construed as being included in the technical scope of the disclosure. Constituent elements of the above-described various embodiments may be combined in a desired manner without departing from the spirit and scope of the invention.

The present disclosure is useful as what discloses a radio wave environment display system and a radio wave environment display method that visually present whether a communication environment of a wireless communication service provided in an area so as to be usable by users is good and thereby suppress lowering of the ease of use of the users.

The invention claimed is:

1. A radio wave environment display system comprising:
a measurement antenna which is installed in a target area of a wireless communication service; and
a radio wave environment display device configured to analyze a communication environment of the wireless communication service using radio wave intensities of radio waves received by the measurement antenna,
wherein the measurement antenna measures a radio wave intensity of a first radio wave transmitted by the wireless communication service, and performs a scan of radio wave intensities of a plurality of radio waves including the first radio wave in the target area,
wherein the radio wave environment display device comprises a processor configured to:
select at least one radio wave intensity of at least one second radio wave having a frequency that is the same as or in the vicinity of a frequency of the first radio wave from the plurality of radio waves obtained by the scan; and
calculate a communication environment of the wireless communication service on the basis of a difference between the radio wave intensity of the first radio wave and the at least one radio wave intensity of the at least one second radio wave, and causes a display to display thereon the communication environment, and wherein if a plurality of radio wave intensities of a plurality of second radio waves are selected as the at least one radio wave intensity of the at least one second radio wave, the radio wave environment display device calculates the communication environment on the basis of a difference between the radio wave intensity of the first radio wave and a result obtained by adding the radio wave intensities of the plurality of second radio waves.

2. The radio wave environment display system according to claim 1, wherein the processor of the radio wave environment display device causes the display to display thereon the communication environment of the wireless communication service in an image indicating a shape of the target area.

3. The radio wave environment display system according to claim 1, wherein the measurement antenna comprises a polyhedral body having surfaces on which antennas are installed, and wherein the antennas installed on the surfaces are time-divisionally used to alternately perform measurement of the radio wave intensity of the first radio wave and measurement of the radio wave intensities of the plurality of radio waves.

4. The radio wave environment display system according to claim 1, wherein the measurement antenna comprises a polyhedral body having surfaces on which antennas are installed, respectively, and, wherein at least one of the antennas installed on at least one of the surfaces of the polyhedral body is used to perform measurement of a radio wave environment for the plurality of radio waves, and a remainder of the antennas installed on a remainder of the surfaces of the polyhedral body is used to perform measurement of a radio wave environment for the first radio wave.

5. The radio wave environment display system according to claim 1, wherein if presence of a radio wave other than the first radio wave is detected in the target area, the processor of the radio wave environment display device outputs information indicating that the radio wave other than the first radio wave exists to an output device.

6. The radio wave environment display system according to claim 1, wherein the processor of the radio wave environment display device is further configured to:

receive information of a communication environment of the wireless communication service calculated on the basis of radio wave intensities of the first radio wave and the at least one second radio wave measured in another target area; and cause the display to display thereon the communication environment of the wireless communication service in the target area and the communication environment of the wireless communication service in the another target area so as to be adjacent to each other.

7. A radio wave environment display method in a radio wave environment display system comprising a measurement antenna which is installed in a target area of a wireless communication service and a radio wave environment display device configured to analyze a communication environment of the wireless communication service using radio wave intensities of radio waves received by the measurement antenna, the radio wave environment display method comprising:

measuring, by the measurement antenna, a radio wave intensity of a first radio wave transmitted by the wireless communication service;

performing, by the measurement antenna, a scan of radio wave intensities of a plurality of radio waves including first radio wave in the target area;

selecting, by the radio wave environment display device, at least one radio wave intensity of at least one second radio wave having a frequency that is the same as or in the vicinity of a frequency of the first radio wave from the plurality of radio waves obtained by the scan; and calculating, by the radio wave environment display device, a communication environment of the wireless communication service on the basis of a difference between the radio wave intensity of the first radio wave and the at least one radio wave intensity of the at least one second radio wave, and causing a display to display thereon the communication environment, wherein if a plurality of radio wave intensities of a plurality of second radio waves are selected as the at least one radio wave intensity of the at least one second radio wave, calculating, by the radio wave environment display device, the communication environment on the basis of a difference between the radio wave intensity of the first radio wave and a result obtained by adding the radio wave intensities of the plurality of second radio waves.

\* \* \* \* \*